(12) United States Patent
Altice, Jr. et al.

(10) Patent No.: US 7,332,786 B2
(45) Date of Patent: Feb. 19, 2008

(54) ANTI-BLOOMING STORAGE PIXEL

(75) Inventors: Peter P. Altice, Jr., Meridian, ID (US); Jeffrey A. McKee, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 531 days.

(21) Appl. No.: 10/721,169

(22) Filed: Nov. 26, 2003

(65) Prior Publication Data

US 2005/0110093 A1    May 26, 2005

(51) Int. Cl.
*H01L 31/00*    (2006.01)

(52) U.S. Cl. .................. 257/445; 257/443; 257/431
(58) Field of Classification Search ............. 257/445, 257/443, 431
See application file for complete search history.

(56) References Cited

U.S. PATENT DOCUMENTS

| | | | |
|---|---|---|---|
| 5,955,753 | A | 9/1999 | Takahashi |
| 6,107,655 | A | 8/2000 | Guidash |
| 6,160,281 | A | 12/2000 | Guidash |
| 6,218,656 | B1 | 4/2001 | Guidash |
| 6,352,869 | B1 | 3/2002 | Guidash |
| 6,423,994 | B1 | 7/2002 | Guidash |
| 6,552,323 | B2 | 4/2003 | Guidash et al. |
| 6,657,665 | B1 | 12/2003 | Guidash |
| 6,947,088 | B2 | 9/2005 | Kochi |

*Primary Examiner*—Long Pham
(74) *Attorney, Agent, or Firm*—Dickstein Shapiro, LLP

(57) ABSTRACT

Embodiments of the present invention provide pixel cells with increased storage capacity, which are capable of anti-blooming operations. In an exemplary embodiment a pixel cell has an electronic shutter that transfers charge generated by a photo-conversion device to a storage node before further transferring the charge to the pixel cell's floating diffusion node. Each pixel cell also includes an anti-blooming transistor for directing excess charge out of each respective pixel cell, thus preventing blooming. Additionally, two or more pixel cells of an array may share a floating diffusion node and reset and readout circuitry.

47 Claims, 14 Drawing Sheets

ANTI-BLOOMING STORAGE PIXEL

FIELD OF THE INVENTION

The present invention relates to the field of semiconductor devices, particularly to an imager having improved storage capacity and blooming control.

BACKGROUND OF THE INVENTION

An imager, for example, a complementary metal oxide semiconductor (CMOS) imager, includes a focal plane array of pixel cells; each cell includes a photo-conversion device, for example, a photogate, photoconductor or a photodiode overlying a substrate for producing a photo-generated charge in a doped region of the substrate. A readout circuit is provided for each pixel cell and includes at least a source follower transistor and a row select transistor for coupling the source follower transistor to a column output line. The pixel cell also typically has a floating diffusion node, connected to the gate of the source follower transistor. Charge generated by the photo-conversion device is sent to the floating diffusion node. The imager may also include a transistor for transferring charge from the photo-conversion device to the floating diffusion node and another transistor for resetting the floating diffusion node to a predetermined charge level prior to charge transference.

FIG. 1 illustrates a block diagram of a CMOS imager device 101 having a pixel array 100 with each pixel cell being constructed as described above. Pixel array 100 comprises a plurality of pixels arranged in a predetermined number of columns and rows. The pixels of each row in array 100 are all turned on at the same time by a row selected line, and the pixels of each column are selectively output by respective column select lines. A plurality of rows and column lines are provided for the entire array 100. The row lines are selectively activated in sequence by the row driver 158 in response to row address decoder 157, and the column select lines are selectively activated in sequence for each row activated by the column driver 155 in response to column address decoder 154. Thus, a row and column address is provided for each pixel.

The CMOS imager is operated by the timing and control circuit 156, which controls address decoders 157, 154 for selecting the appropriate row and column lines for pixel readout, and row and column driver circuitry 158, 155 which apply driving voltage to the drive transistors of the selected row and column lines. Pixel output signals typically include a pixel reset signal, $V_{rst}$, taken from the floating diffusion node when it is reset and a pixel image signal, $V_{photo}$, which is taken from the floating diffusion node after photo-generated charge representing an image is transferred to it. $V_{rst}$ and $V_{photo}$ are read by a sample and hold (S/H) circuit 153 and are subtracted by a differential amplifier 152, which produces a differential signal, $V_{rst}-V_{photo}$, for each pixel cell, which represents the amount of light impinging on the pixel cells. This differential signal is digitized by an analog to digital converter 151. The digitized pixel signals are then fed to an image processor 150 to form a digital image.

Imager pixel cells, including CMOS imager pixel cells, typically have low signal to noise ratios and narrow dynamic range because of their inability to fully collect, transfer, and store the full extent of electric charge generated by the photosensitive area of the photo-conversion device. The dynamic range of a pixel is commonly defined as the ratio of its largest non-saturating signal to the standard deviation of the noise under dark conditions. The signal representative of the photo-generated charge is proportional to the amount of charge collected by the photo-conversion device, and may be diminished if charge is lost during transfer or storage.

Another source of pixel cell error is called blooming. Blooming is caused when too much light enters a pixel cell and the pixel cell becomes saturated and unable to hold all of the charge generated by the photo-conversion device. Consequently, the excess photo-generated charge may overflow the pixel cell and contaminate adjacent pixel cells. The overflow of charge from one pixel cell to the next can create a bright spot or streak in a resultant image, called blooming. Anti-blooming gates have been developed to bleed off charge from a photo-conversion device to avoid contamination of adjacent pixel cells and the resultant error.

Since the size of the electrical signals generated by any given pixel in a CMOS imager are very small, it is especially important for the signal to noise ratio and dynamic range of the pixel cell to be as high as possible. Generally speaking, these desired features are not attainable, however, without additional devices that increase the size of the pixel cell. Therefore, there is a need for an improved pixel cell for use in an imager that provides high signal to noise ratio and high dynamic range while maintaining a small pixel size.

BRIEF SUMMARY OF THE INVENTION

Exemplary embodiments of the present invention address the above described problems and provide pixel cells with increased storage capacity that are capable of anti-blooming operations resulting in high signal to noise ratio and high dynamic range. In an exemplary embodiment a pixel cell has an electronic shutter that transfers charge generated by a photo-conversion device to a storage node before further transferring the charge to the pixel cell's floating diffusion node. Each pixel cell also includes an anti-blooming transistor for directing excess charge out of each respective pixel cell, thus preventing blooming. Additionally, two or more pixel cells of an array may share a floating diffusion node and reset and readout circuitry. The storage node can be constructed with a capacitor, which can be designed to effectively increase the overall storage capacity of the pixel cell.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

Figure 1:
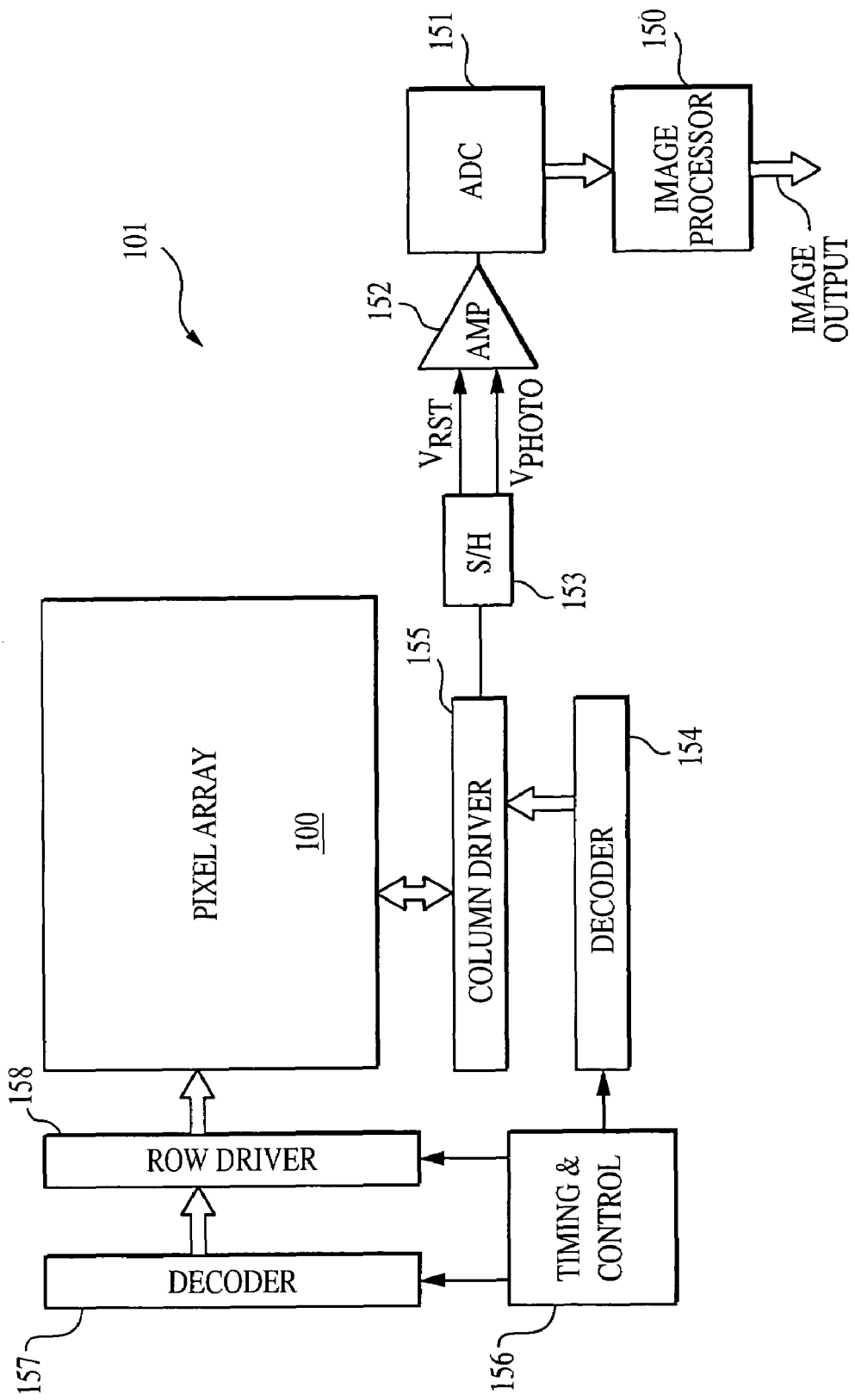
FIG. 1 is a block diagram of a conventional CMOS imager.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures, as well as insulating substrates, such as quartz or glass. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" refers to a picture element unit cell containing a photo-conversion device and other devices for converting electromagnetic radiation to an electrical signal. For purposes of illustration, a representative pixel cell is illustrated in the figures and description herein, and typically fabrication of all pixel cells in an image sensor will proceed simultaneously in a similar fashion. The term "multiplexed pixel cells" refers to one or more pixel cells that share at least one common device.

Image sensors implementing pixel cells having increased storage, with decreased size are disclosed in co-pending U.S. application Ser. Nos. 10/721,190 and 10/721,191 which are incorporated herein by reference. U.S. application Ser. No. 10/721,190 relates to an image sensor implementing pixel cells having an electronic shutter which includes a shutter transistor having its gate electrically connected to a storage capacitor. U.S. application Ser. No. 10/721,191 relates to an image sensor implementing pixel cells having an electronic shutter which includes a gated storage node.

Figure 2:
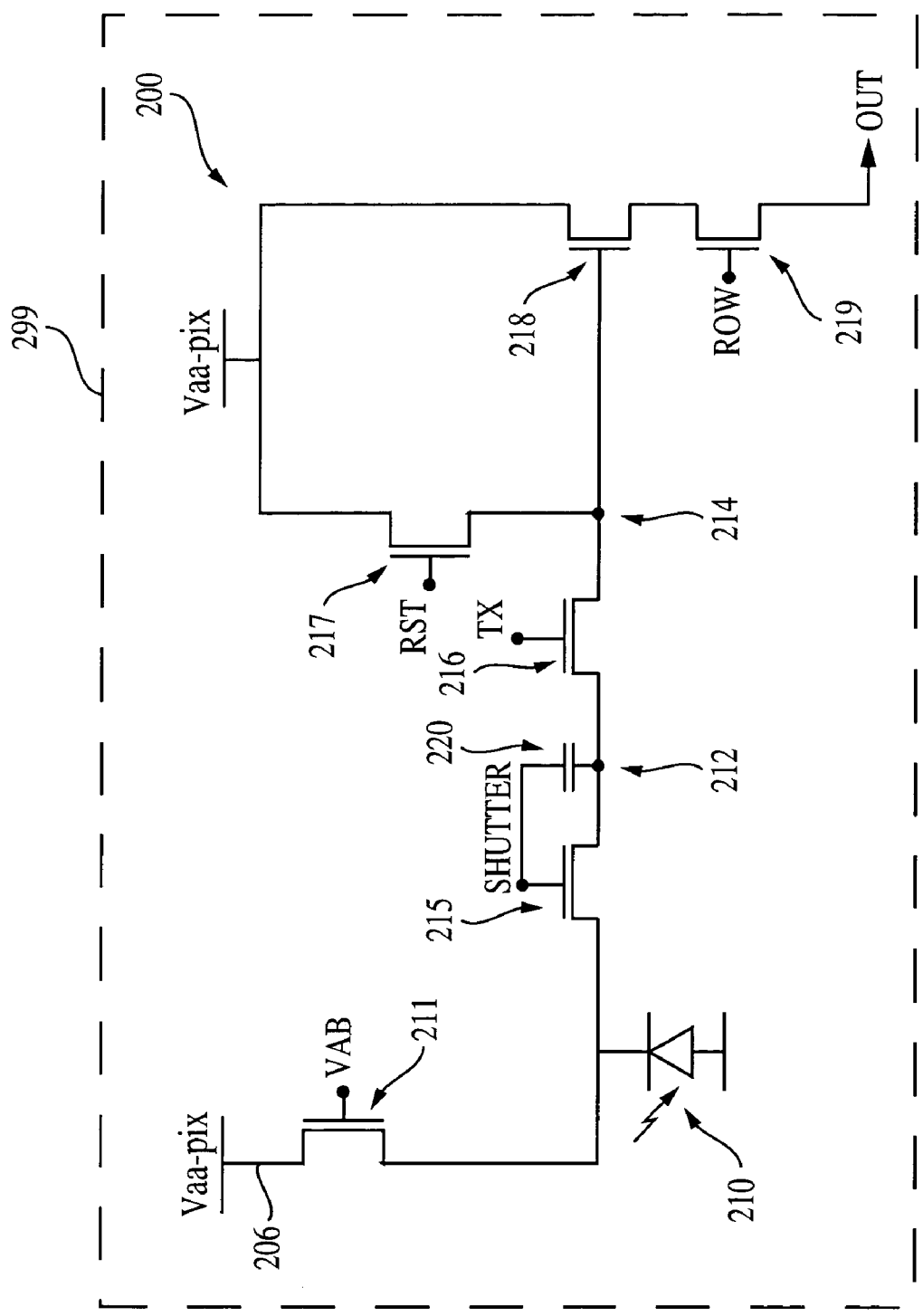
FIG. 2 is a schematic circuit diagram of a capacitive storage pixel cell with an anti-blooming gate according to an exemplary embodiment of the invention.

FIG. 2 is a schematic diagram of a pixel cell 200 according to an exemplary embodiment of the invention. As shown in FIG. 2, pixel cell 200 may be included on a semiconductor chip 299 as part of an integrated circuit. In fact, any pixel cell described hereafter in connection with exemplary embodiments of the invention may be included on semiconductor chip 299 as part of an integrated circuit. For simplicity, only pixel cell 200 is specifically depicted as being included on semiconductor chip 299.

Figure 3:
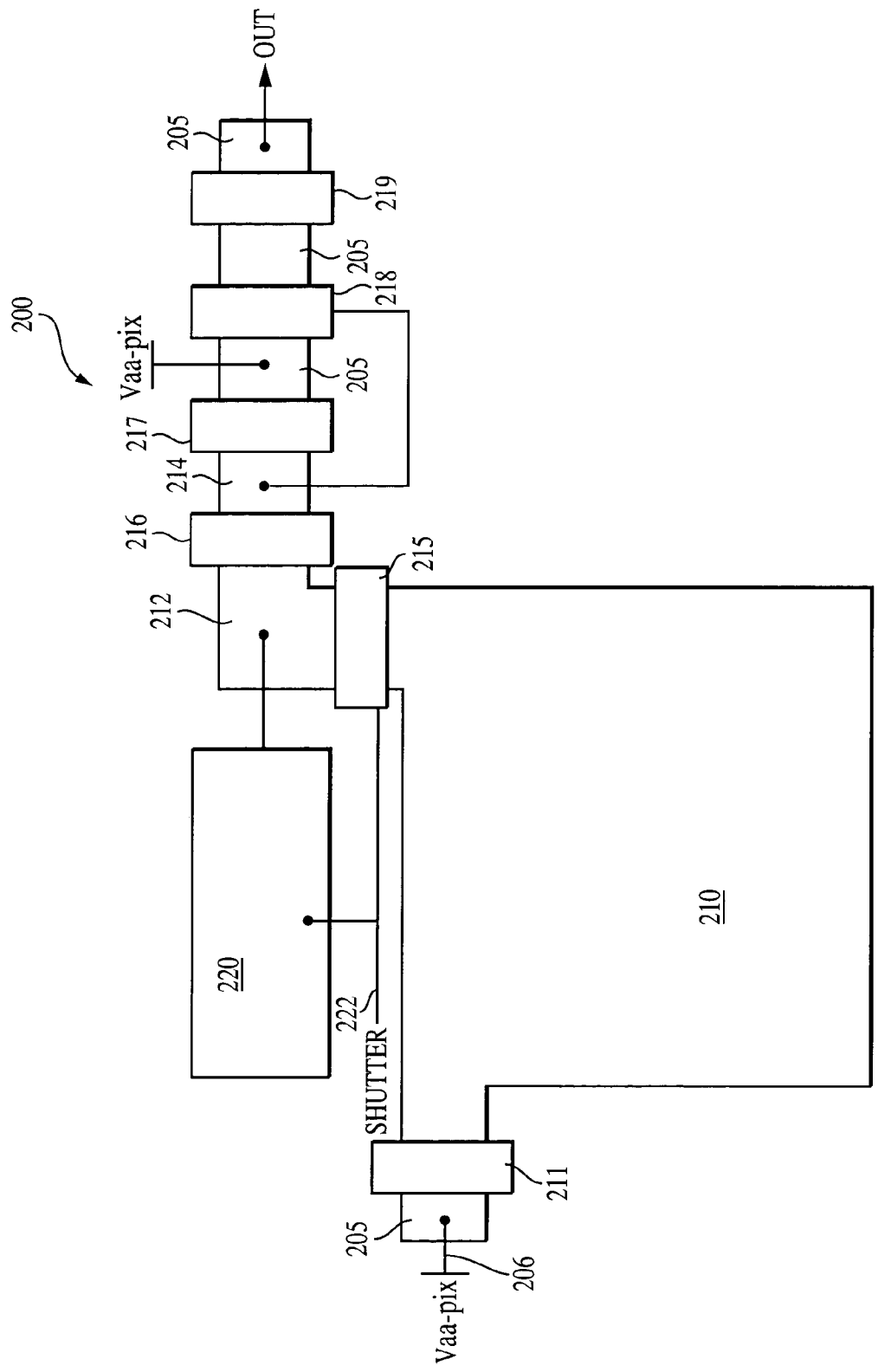
FIG. 3 is a top plan view of an embodiment of the pixel cell of FIG. 2.

FIG. 3 is a top plan view of an embodiment of pixel cell 200. The pixel cell 200 comprises a photo-conversion device 210, which is illustratively a pinned photodiode. Pinned photodiode 210 may be, for example, a pnp-type pinned photodiode and include a lightly doped n− region within a p-type substrate and underlying a heavily doped p+ surface layer as is known in the art.

Pinned photodiode 210 generates charge from external light incident to the pixel cell 200. Pinned photodiode 210 is electrically connected to an anti-blooming transistor, which directs excess photo-generated charge from the pinned photodiode 210 out of pixel cell 200 to a line 206 so as to prevent blooming. The anti-blooming transistor is configured to be leaky when pinned photodiode 210 is near saturation. For this, the voltage $V_{AB}$ on the anti-blooming gate 211 is sufficiently high to allow the flow of excess photo-generated charge out of pinned photodiode 210 when pinned photodiode 210 is near saturation.

A source/drain region 205 of the anti-blooming transistor is electrically connected to a line 206. Line 206 may be connected to the applied pixel array voltage $V_{aa-pix}$, as illustrated in FIG. 2, or may be separate and have another voltage as desired. Also, $V_{AB}$ can be changed and the integration time at each voltage can be varied to achieve a high dynamic range. For example, and without being limiting, $V_{AB}$ can be 0.4 Volts (V) with an integration time of 30 milliseconds (ms); 0.3 V with an integration time of 5 ms; and 0.1 V with an integration time of 500 microseconds (μs).

Pinned photodiode 210 is also electrically connected to a shutter transistor 215, which determines an integration time for the pixel cell 200. Illustratively, shutter transistor having a gate 215 is a global shutter transistor, which operates synchronously with other global shutter transistors of other pixel cells in an array such that all pixel cells of an array have a same integration time. As shown in FIG. 3, the gate 215 of shutter transistor is connected to a shutter line 222, which applies shutter signals to the shutter gate. The gate 215 of global shutter transistor is capacitively coupled to a storage node 212 by capacitor 220. When turned on by a shutter signal, the global shutter transistor gate 215 turns on to transfer the photo-generated charge from pinned photodiode 210 to storage node 212, which stores the photo-generated charge until a time for read out.

Pixel cell 200 also comprises a transfer transistor that includes a transfer gate 216, which is controlled by a transfer signal (TX). Transfer gate 216 gates the flow of photo-generated charge from the storage node 212 to a sensing node. The sensing node may be any device which can receive charge from storage node 212 for readout, and is illustratively a floating diffusion node 214. Floating diffusion node 214 may be a lightly doped n− region below a surface of the substrate as is known in the art. There is a gate 217 of a reset transistor, which operates in response to a reset signal (RST) to reset the floating diffusion node to a predetermined voltage, illustratively $V_{aa-pix}$. Floating diffusion node 214 is electrically connected to a gate 218 of a source follower transistor. A source/drain terminal of the source follower transistor is electrically connected to row select transistor, which has a gate 219, for outputting a signal from the source follower transistor to an output terminal in response to a row select signal (ROW). Source/drain regions of the anti-blooming, reset, source follower, and row select transistors are designated as 205.

Because the photo-generated charge is stored in the storage node 212, the floating diffusion node 214 can be reset during the same frame that the image is captured, which permits a correlated double sampling operation resulting in reduced noise and a more accurate image. When the photo-generated charge is to be read out, it is transferred from storage node 212 to floating diffusion node 214 by transfer gate 216. The charge is applied to a gate 218 of the source follower transistor for readout through the row select transistor.

Figure 4:
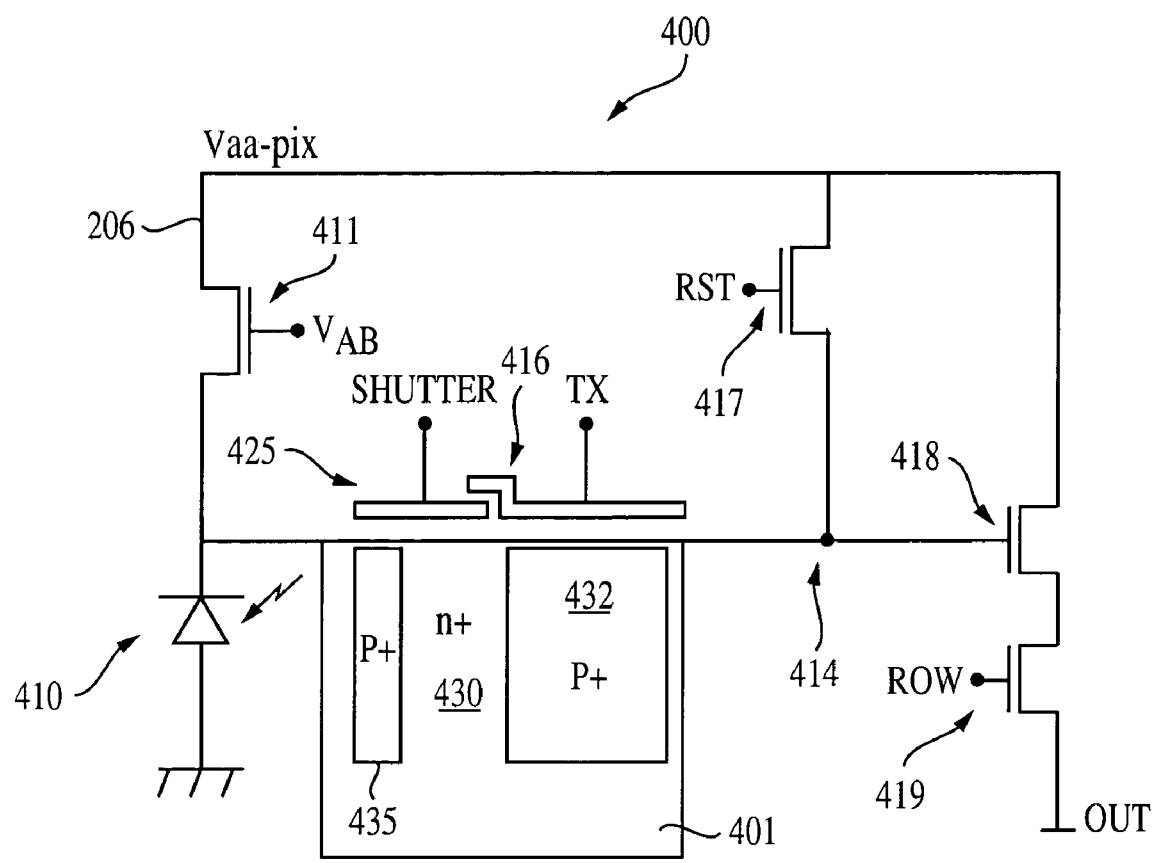
FIG. 4 is a schematic circuit diagram of a storage gate pixel cell with an anti-blooming gate according to an exemplary embodiment of the invention.
Figure 5:
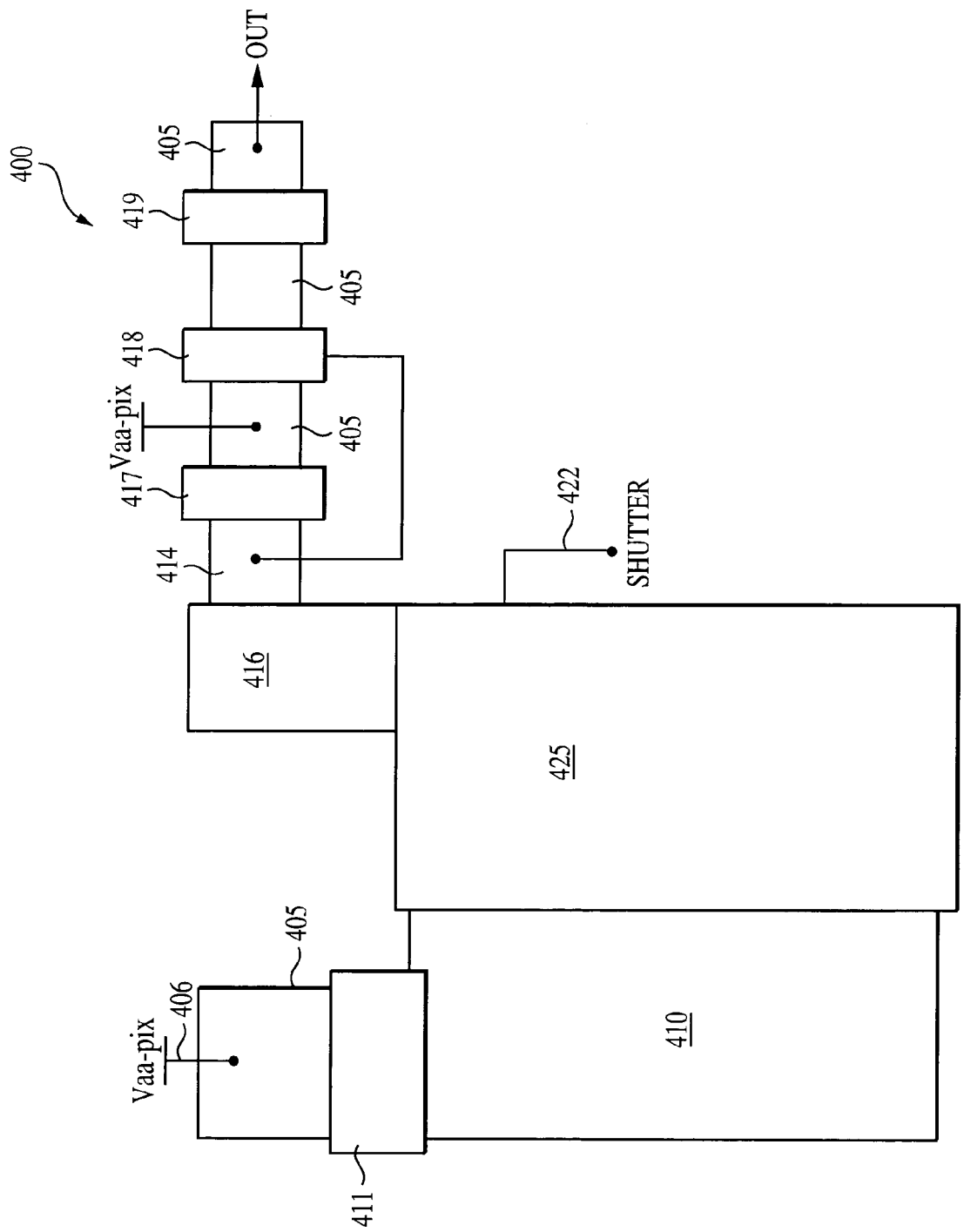
FIG. 5 is a top plan view of an embodiment of the pixel cell of FIG. 4.

FIG. 4 is a schematic diagram of a pixel cell 400 according to an exemplary embodiment of the invention with some components shown in schematic cross section. FIG. 5 is a top plan view of an embodiment of pixel cell 400. Pixel cell 400 comprises a photo-conversion device, which is illustratively a pinned photodiode 410. Pinned photodiode 410 is illustratively a pnp-type photodiode. Pinned photodiode 410 generates charge from external light incident on pixel cell 400.

Pinned photodiode 410 is electrically connected to an anti-blooming transistor having a gate 411, which directs excess photo-generated charge from the pinned photodiode 410 and out of pixel cell 400 to a line 406 so as to prevent blooming. The anti-blooming transistor is configured to be leaky when pinned photodiode 410 is near saturation. For this, the voltage $V_{AB}$ on the anti-blooming gate 411 is sufficiently high to allow the flow of excess photo-generated charge out of pinned photodiode 410 when pinned photodiode 410 is near saturation.

A source/drain region 405 of the anti-blooming transistor is electrically connected to a line 406. Line 406 may be connected to the applied pixel array voltage $V_{aa-pix}$, as illustrated in FIG. 4, or may be separate and have another voltage as desired. Also, $V_{AB}$ can be changed and the integration time at each voltage can be varied to achieve a high dynamic range. For example, and without being limiting, $V_{AB}$ can be 0.4 V with an integration time of 30 ms; 0.3 V with an integration time of 5 ms; and 0.1 V with an integration time of 500 µs.

Pinned photodiode 410 is adjacent to a gate 425 of a gate-controlled storage node 430. As shown in FIG. 4, storage node 430 can be a heavily doped region of a second conductivity type, e.g., n-type, below the surface of the substrate 401. Between pinned photodiode 410 and the storage node 430 is a first barrier region 435. Barrier region 435 can be a heavily doped region of a first conductivity type, e.g. p-type, implanted between pinned photodiode 410 and storage node 430 to control charge transfer from pinned photodiode 410 to storage node 430. Storage node 430 and the barrier region 435 are below gate 425 and each is controlled by gate 425. Gate 425 is connected to shutter line 422 through which gate 425 receives shutter signals, which control gate 425. When gate 425 is in an off-state, there is a potential barrier in the barrier region 435, which prevents charge from flowing from the pinned photodiode 410 to the storage node 430. When a shutter signal is applied to turn on gate 425, a potential barrier in barrier region 435 decreases to allow charge to flow between pinned photodiode 410 and storage node 430.

Adjacent to gate 425 is a gate 416 of a transfer transistor. As shown in FIG. 4, transfer gate 416 overlaps a portion of gate 425. In response to a transfer signal (TX), transfer gate 416 gates the flow of photo-generated charge from storage node 430 to a sensing node, which is illustratively a floating diffusion node 414. Below gate 416, there can be a second barrier region 432. Barrier region 432 can be a heavily doped region of a first conductivity type, e.g. p-type, implanted between storage node 430 and floating diffusion node 414. Barrier region 432 serves to maintain charge isolation between storage node 430 and floating diffusion node 414 when transfer gate 416 is in an off-state. When transfer gate 416 is in an on state, a potential barrier in barrier region 432 decreases to allow charge to flow between storage node 430 and floating diffusion region 414.

There is a gate 417 of a reset transistor, which operates in response to a reset signal (RST) to reset the floating diffusion node 414 to a predetermined voltage, illustratively $V_{aa-pix}$. Floating diffusion node 414 is electrically connected to a gate 418 of a source follower transistor. A source/drain terminal 405 of source follower transistor is electrically connected to a row select transistor, having a gate 419, for outputting a signal from the source follower transistor to an output terminal in response to a row select signal (ROW). Source/drain regions 405 of the anti-blooming, reset, source follower, and row select transistors are designated 405.

Similarly to pixel cell 200 of FIGS. 2 and 3, because the photo-generated charge is stored in the storage node 430, the floating diffusion node 414 can be reset during the same frame that the image is captured, which permits a correlated double sampling operation resulting in reduced noise and a more accurate image.

Pixel cells 200 and 400 can be implemented in an imager and operated as described in incorporated co-pending U.S. application Ser. Nos. 10/721,190 and 10/721,191, with the added advantage that pixel cells according to embodiments of the present invention each include an anti-blooming transistor 211, 411.

Figure 6:
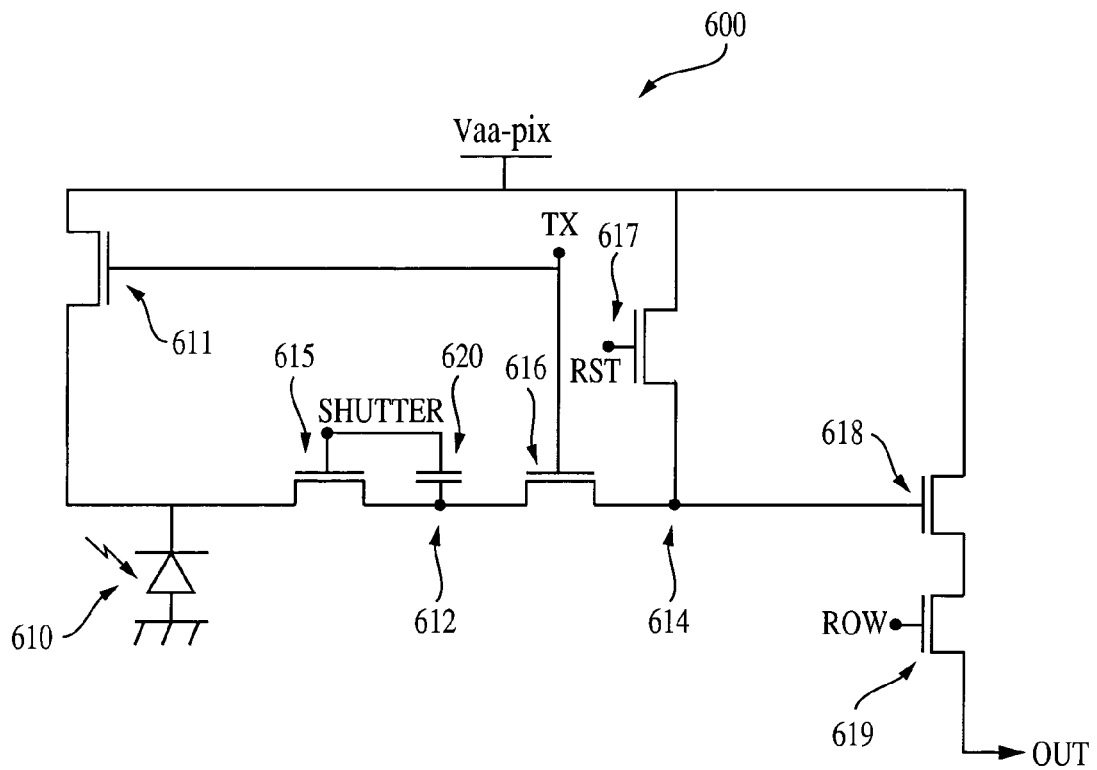
FIG. 6 is a schematic circuit diagram of a capacitive storage pixel cell with a transfer gate connected to an anti-blooming gate according to an exemplary embodiment of the invention.
Figure 7:
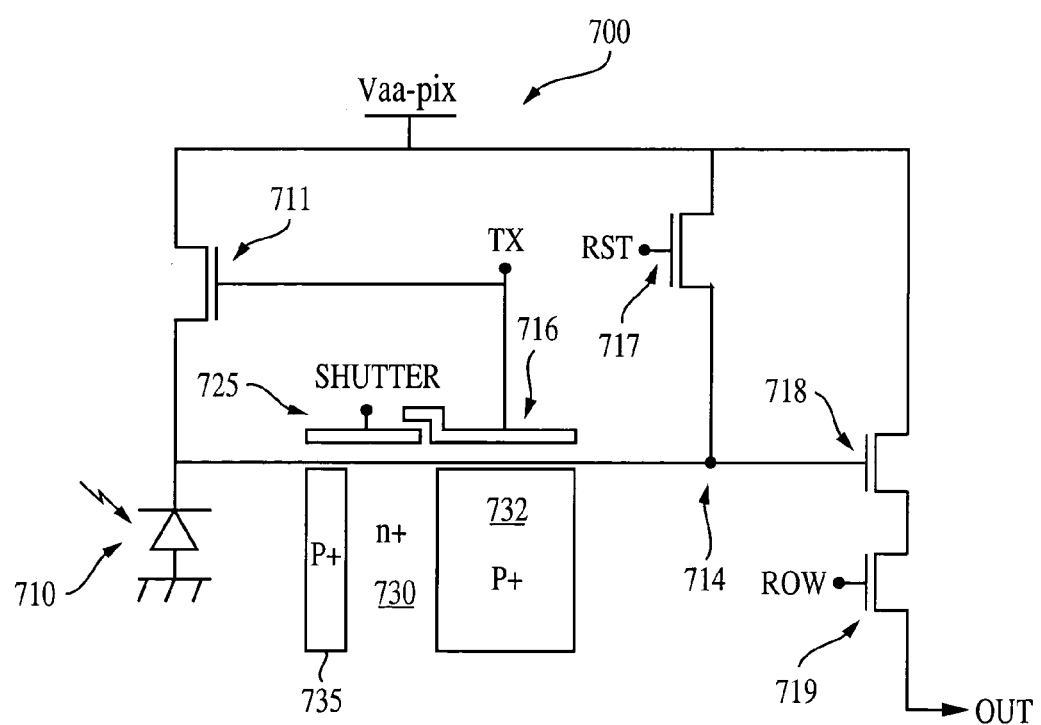
FIG. 7 is a schematic circuit diagram of a storage gate pixel cell with a transfer gate connected to an anti-blooming gate according to an exemplary embodiment of the invention.

FIGS. 6 and 7 are schematic diagrams of pixel cells 600 and 700, respectively, according to exemplary embodiments of the invention. Pixel cell 600 is similar to pixel cell 200, except that the gate 616 of the transfer transistor is connected to the gate 611 of the anti-blooming transistor. Accordingly, pixel cell 600 also includes pinned photodiode 610, shutter gate 615, storage node 612, capacitor 620, floating diffusion node 614, reset gate 617, source follower gate 618, and row select gate 619.

Likewise, pixel cell 700 is similar to pixel cell 400, except that the gate 716 of the transfer transistor is connected to the gate 711 of the anti-blooming transistor. Accordingly, pixel cell 700 also includes pinned photodiode 710, shutter gate 725, storage node 730, barrier region 735, barrier region 732, floating diffusion node 714, reset gate 717, source follower gate 718, and row select gate 719.

By connecting transfer gates 616, 716 to anti-blooming gates 611, 711, pixel cells 600 and 700 may have fewer signal lines than are required for pixel cells 200 and 400, respectively. For purposes of this specification, the term "signal lines" refers to lines, for example metal lines, that carry signals to or from devices of a pixel cell. Additionally, tying the drain of the anti-blooming gates 611 and 711 to $V_{aa-pix}$ also serves to improve the size of pixel cells 600 and 700 by keeping the number of signal lines to a minimum. Pixel cells 600 and 700 are each able to employ an anti-blooming transistor without adding additional signal lines to the pixel cells disclosed in the aforementioned U.S. application Ser. Nos. 10/721,190 and 10/721,191.

While the above embodiments are described in connection with the formation of pnp-type photodiodes, the invention is not limited to these embodiments. The invention also has applicability to other types of photo-conversion devices and to photodiodes formed from npn regions in a substrate.

If an npn-type photodiode is formed the dopant and conductivity types of all structures would change accordingly.

Figure 8A:
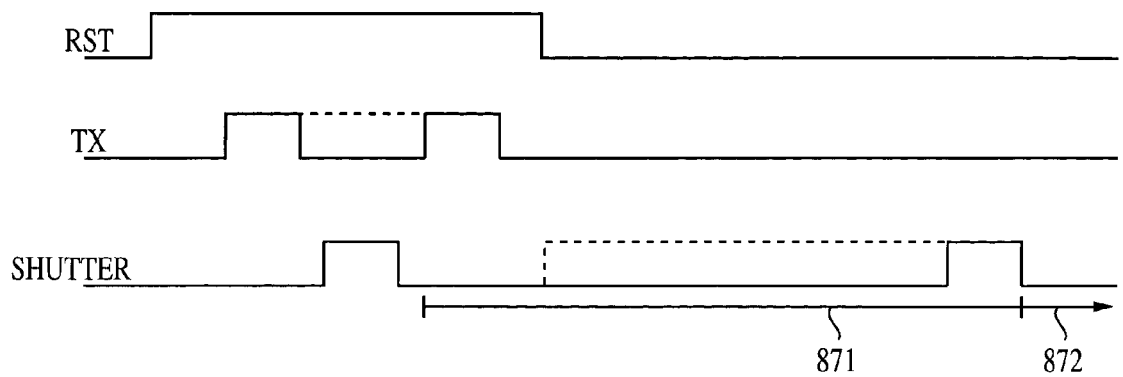
FIG. 8A is an exemplary charge integration timing diagram for the FIGS. 2-5 pixel cells.
Figure 8B:
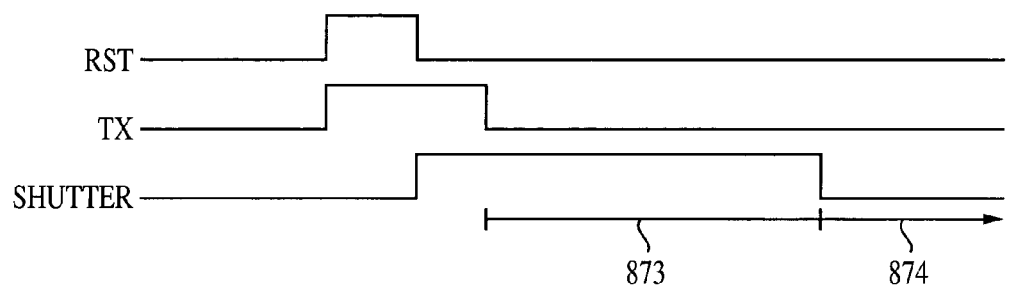
FIG. 8B is an exemplary charge integration timing diagram for the FIGS. 6-7 pixel cells.
Figure 8C:
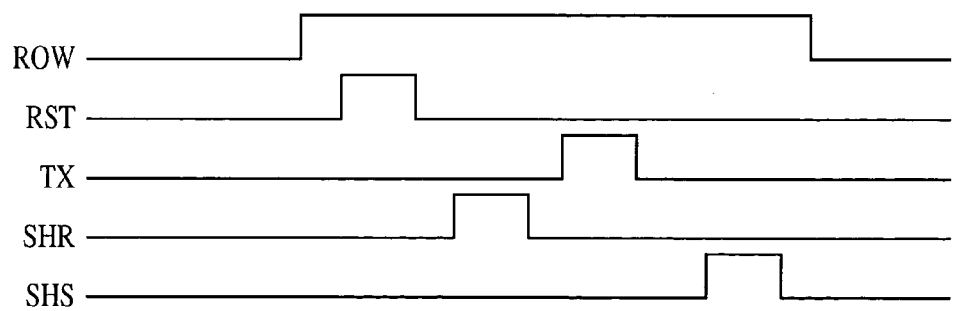
FIG. 8C is an exemplary readout timing diagram for the FIGS. 2-7 pixel cells.

FIGS. 8A-8C depict exemplary charge integration and readout timing diagrams, respectively, for pixel cells according to embodiments of the invention. The signals in FIGS. 8A-8C can be provided by timing and control circuitry similar to circuitry 156 in FIG. 1.

FIG. 8A is an exemplary timing diagram according to an exemplary embodiment of the invention depicting a charge integration timing sequence for pixel cells 200 and 400 where the anti-blooming gate is independent of the transfer gate and is tied to a fixed potential. For simplicity, however, FIG. 8A is described with specific reference to pixel cell 200.

Prior to charge integration by the pinned photodiode 210, the floating diffusion node 214, storage node 212, and pinned photodiode 210 are reset. For this, a reset signal (RST) is held high to operate reset gate 217. At this time, a transfer signal (TX) is cycled from low to high and back to low to operate transfer gate 216 and to reset storage node 212 to a predetermined voltage, which is illustratively $V_{aa-pix}$. Alternatively, for pixel cell 400, the pixel could be processed to have the potential under the gate 425 for the storage node 430 made lower than the potential under the transfer gate 416 when both gates are on, such that TX can remain high, as depicted by the broken TX line. A shutter signal is then cycled from low to high and back to low to operate the shutter gate 215 and to reset pinned photodiode 210 to $V_{aa-pix}$. As shown in FIG. 8B, this can occur while TX is either low or high.

At this point an integration period 871 begins. Also, TX is cycled from low to high and back to low, or TX is brought from high to low, to operate transfer gate 216 and reset storage node 212 and floating diffusion node 214 to $V_{aa-pix}$. RST is then brought back to low. To complete integration period 871, a shutter signal is cycled from low to high and back to low to operate shutter gate 215 and transfer charge from photodiode 210 to storage node 212. Alternatively, as depicted by the broken shutter line, the shutter signal can be held high for a large part of integration period 871 to increase the storage capacity of photodiode 210. After the shutter signal goes low, the charge is stored in the storage node 612, represented by time period 872.

During integration period 871, if pinned photodiode 210 nears saturation or becomes saturated, excess charge leaves the pinned photodiode 210 via the anti-blooming transistor 211. The potential on gate 211 is held such that when the potential of pinned photodiode 210 approaches the substrate 201 potential, charge flows from pinned photodiode 210 under gate 211 to source/drain region 205 of anti-blooming gate 211.

FIG. 8B is an exemplary timing diagram according to an exemplary embodiment of the invention depicting a charge integration timing sequence for pixel cells 600 and 700. For simplicity, however, FIG. 8B is described with specific reference to pixel cell 600.

As shown in FIG. 8B, prior to charge integration by the pinned photodiode 610, the floating diffusion node 614, storage node 612, and pinned photodiode 610 are reset. For this, a reset (RST) and transfer (TX) signal are brought high to turn on the reset gate 617 and transfer gate 616 and to apply a predetermined voltage, which is illustratively $V_{aa-pix}$, to the floating diffusion node 614 and storage node 612. Because the transfer gate 616 is connected to the anti-blooming gate 611, the TX signal also turns on the anti-blooming gate 611. Thereby, pinned photodiode 610 is reset to $V_{aa-pix}$. The RST signal goes low as a shutter signal is brought high.

Once the TX signal is low, the pinned photodiode 610 integrates charge, represented by time period 873. During the integration period 873, the shutter signal is held high and the shutter gate 615 is in an on-state to allow photo-generated charge to flow into the storage node 612, thereby allowing additional time for photo-generated charge to be collected and transferred to storage node 612. After the shutter signal goes low, the charge is stored in the storage node 612, represented by time period 874.

Also, during integration period 873, if pinned photodiode 610 nears saturation or becomes saturated, excess charge leaves the pinned photodiode 610 via the anti-blooming transistor 611. The potential on gate 611 is held such that when the potential of pinned photodiode 210 approaches the substrate (not shown) potential, charge flows from pinned photodiode 610 under gate 611 to a source/drain region of anti-blooming gate 611.

For an array of pixel cells 600, reset of the floating diffusion node 614, storage node 612, and pinned photodiode 610, as well as charge integration may occur synchronously. Accordingly, the signals depicted in FIG. 8B may be global signals applied to respective devices of all pixel cells 600 of an imager. Readout, however, of pixel cells 600 of an array may occur at different times, for example, row by row. Therefore, signals depicted in FIG. 8B may be applied at different times to pixel cells 600 of an array.

FIG. 8C depicts an exemplary readout sequence for any of pixel cells 200, 400, 600, and 700. For simplicity, however, FIG. 8C is described with specific reference to pixel cell 600. As shown in FIG. 8C, row select gate 619 is turned on by a row select signal (ROW). Reset transistor gate 617 is briefly turned on by a RST signal, thereby resetting floating diffusion node 614 to $V_{aa-pix}$. To obtain a pixel reset signal, $V_{rst}$, the voltage on the floating diffusion node 614 is then applied to the source follower gate 618 and subsequently sampled by sample and hold circuitry (not shown) in response to a sample and hold reset signal, SHR. SHR illustrates the time when the reset signal is stored on a sample and hold capacitor (not shown). Accordingly, for this example, $V_{rst}=V_{aa-pix}$.

Photo-generated charge stored in storage node 612 is then transferred to floating diffusion node 614 by turning transfer gate 616 on in response to a TX signal. Because transfer gate 616 is connected to anti-blooming gate 611, when transfer gate 616 is turned on by the TX signal, anti-blooming gate 611 is also turned on and pinned photodiode 610 is reset to $V_{aa-pix}$. Where the transfer gate is not connected to the anti-blooming gate, the anti-blooming gate is not operated in response to a TX signal. With the ROW signal high, the voltage, $V_{photo}$, which is representative of the photo-generated charge, on the floating diffusion node 614 is applied to the gate of source follower transistor 617. Subsequently, $V_{photo}$ is sampled by sample and hold circuitry in response to a sample and hold signal, SHS, and read out. SHS illustrates the time when $V_{photo}$ is stored on a sample and hold capacitor. For readout correlated double sampling can be performed and a differential signal, $V_{rst}-V_{photo}$, may be obtained.

FIGS. 9A-10B are schematic diagrams of multiplexed pixel cells according to exemplary embodiments of the invention and depict two or more pixel cells sharing a floating diffusion node and readout and reset circuitry. U.S. application Ser. Nos. 10/721,190 and 10/721,190, incorporated herein, disclose two or more pixel cells sharing a sensing node, e.g., a floating diffusion node, and pixel readout and reset circuitry. For purposes of this specification, the term "pixel readout and reset circuitry" refers to any circuitry within a pixel cell which serves to readout photo-generated charge from a sensing node, or to reset the sensing node to a predetermined voltage. FIGS. 9A through 10B, however, also show an anti-blooming transistor in each pixel cell.

Figure 9A:
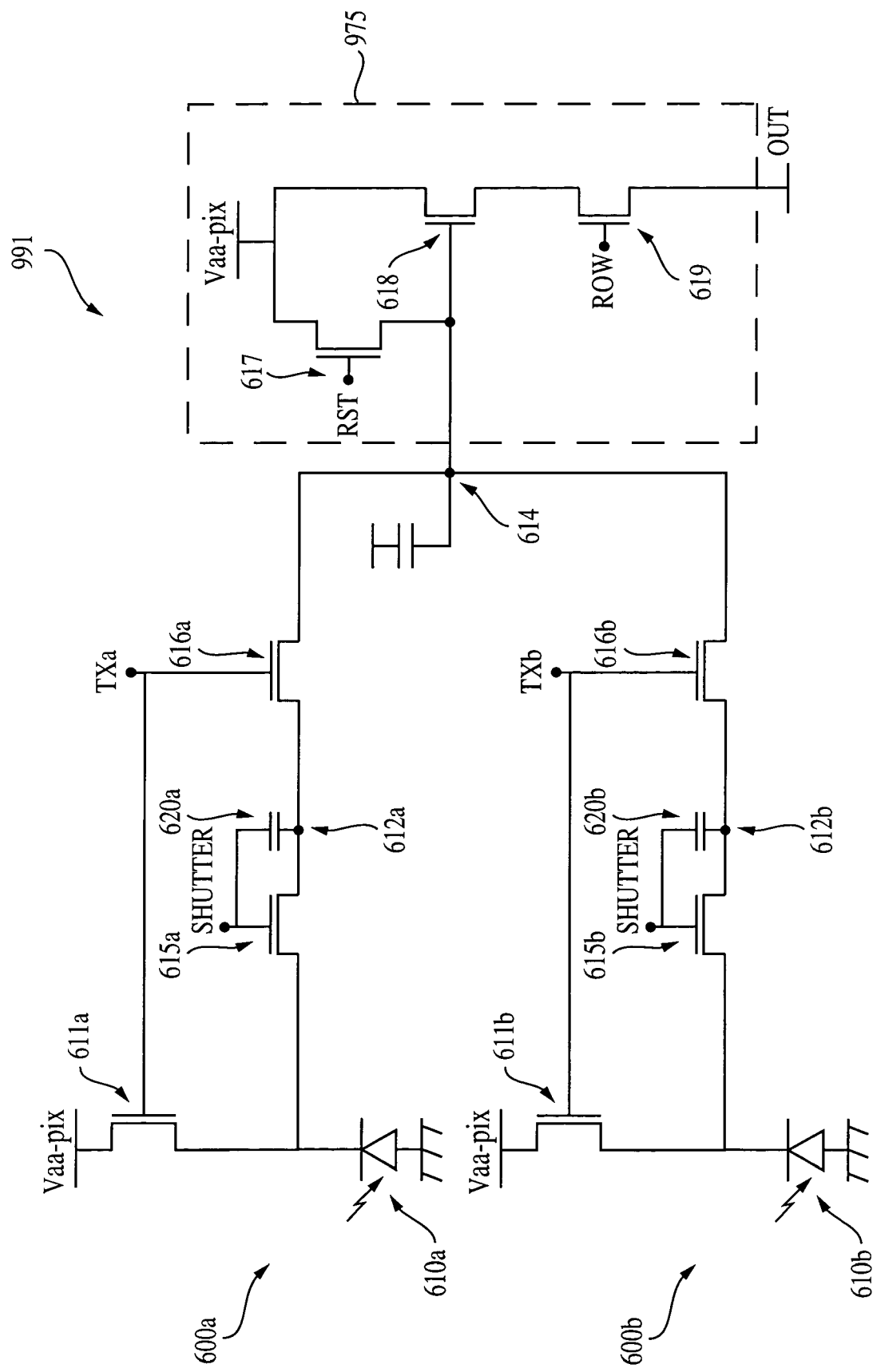
FIG. 9A-10B are schematic circuit diagrams of pixel circuits according to exemplary embodiments of the invention.
Figure 9B:
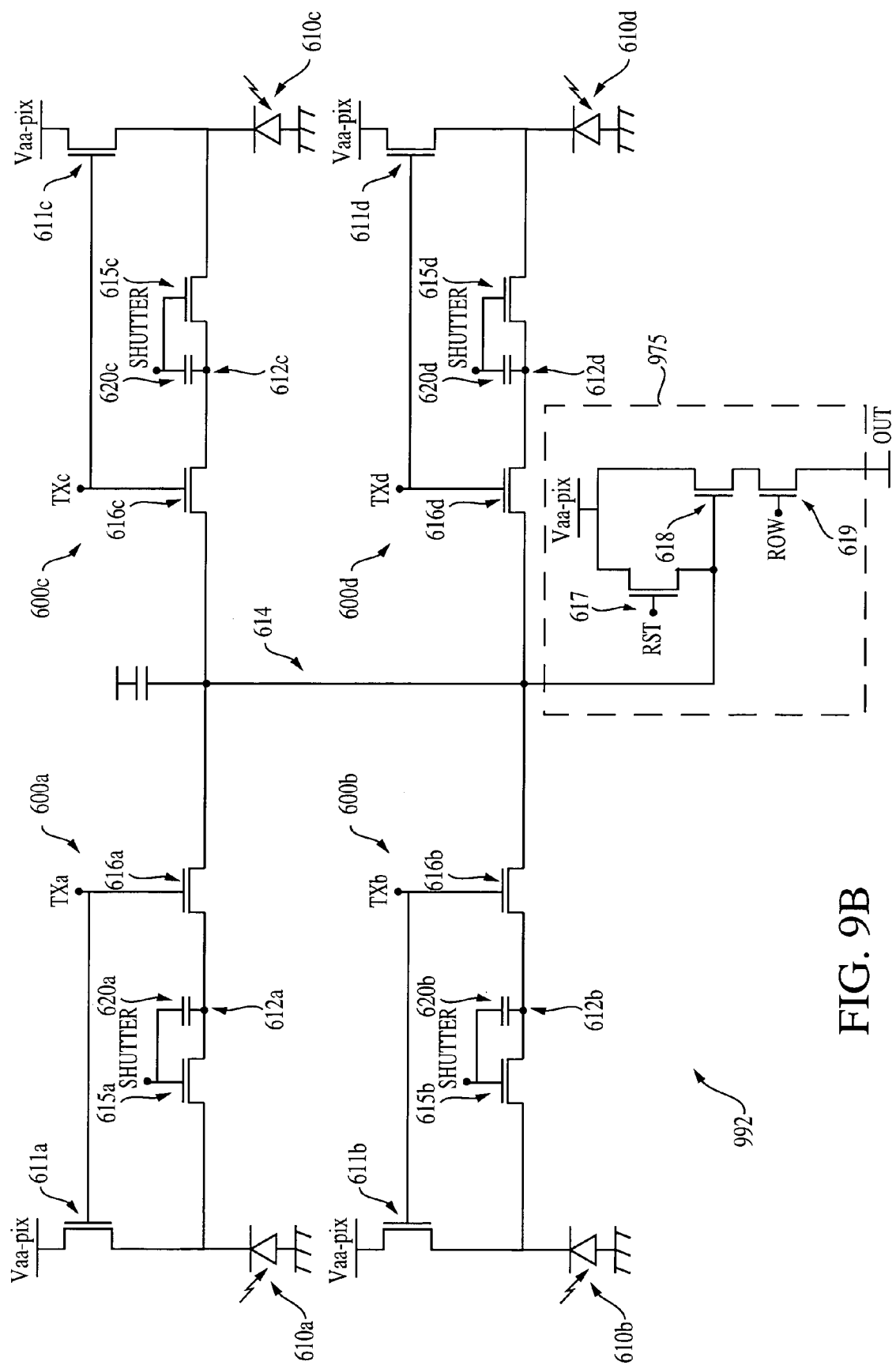
Figure 10A:
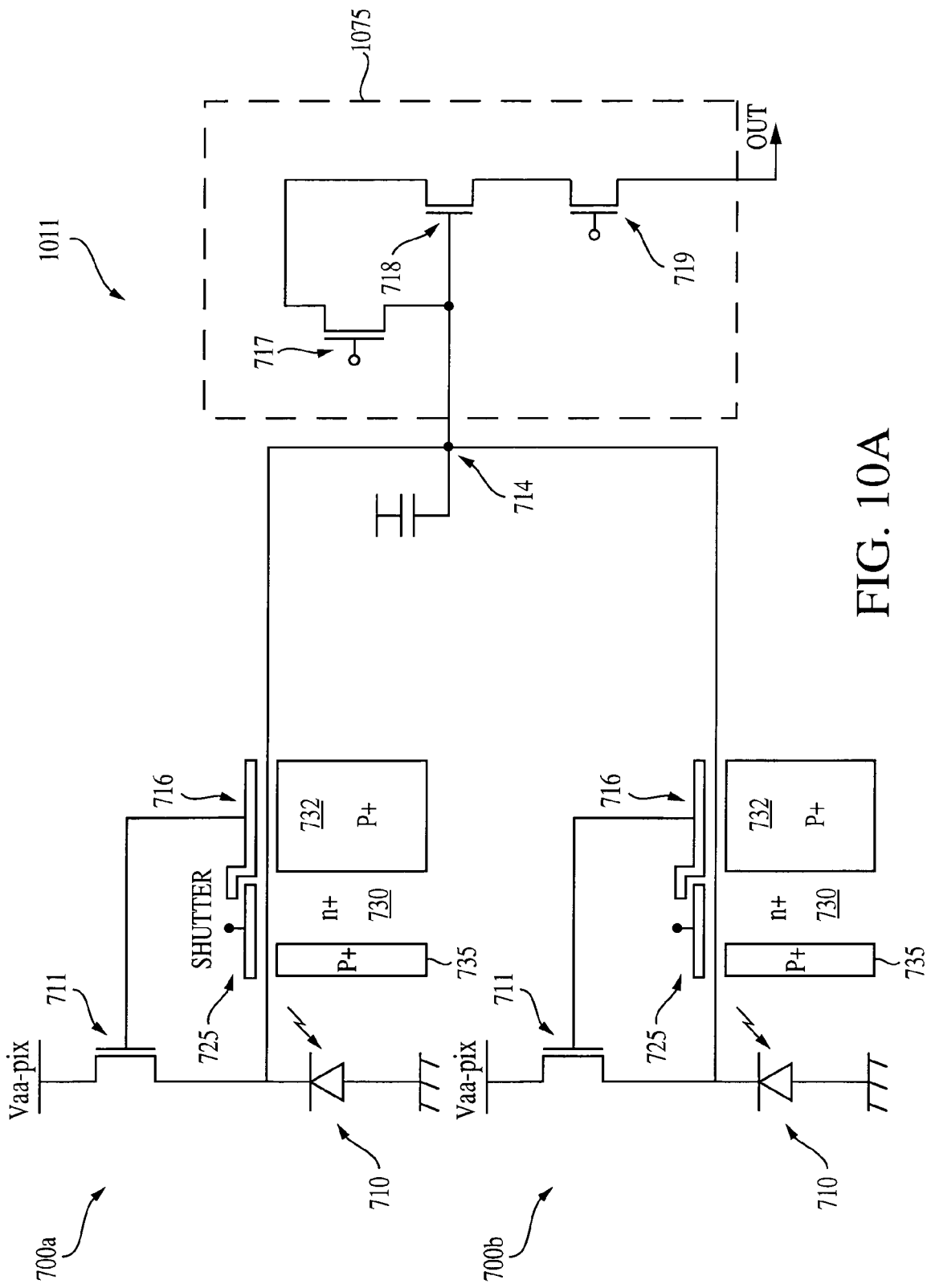
Figure 10B:
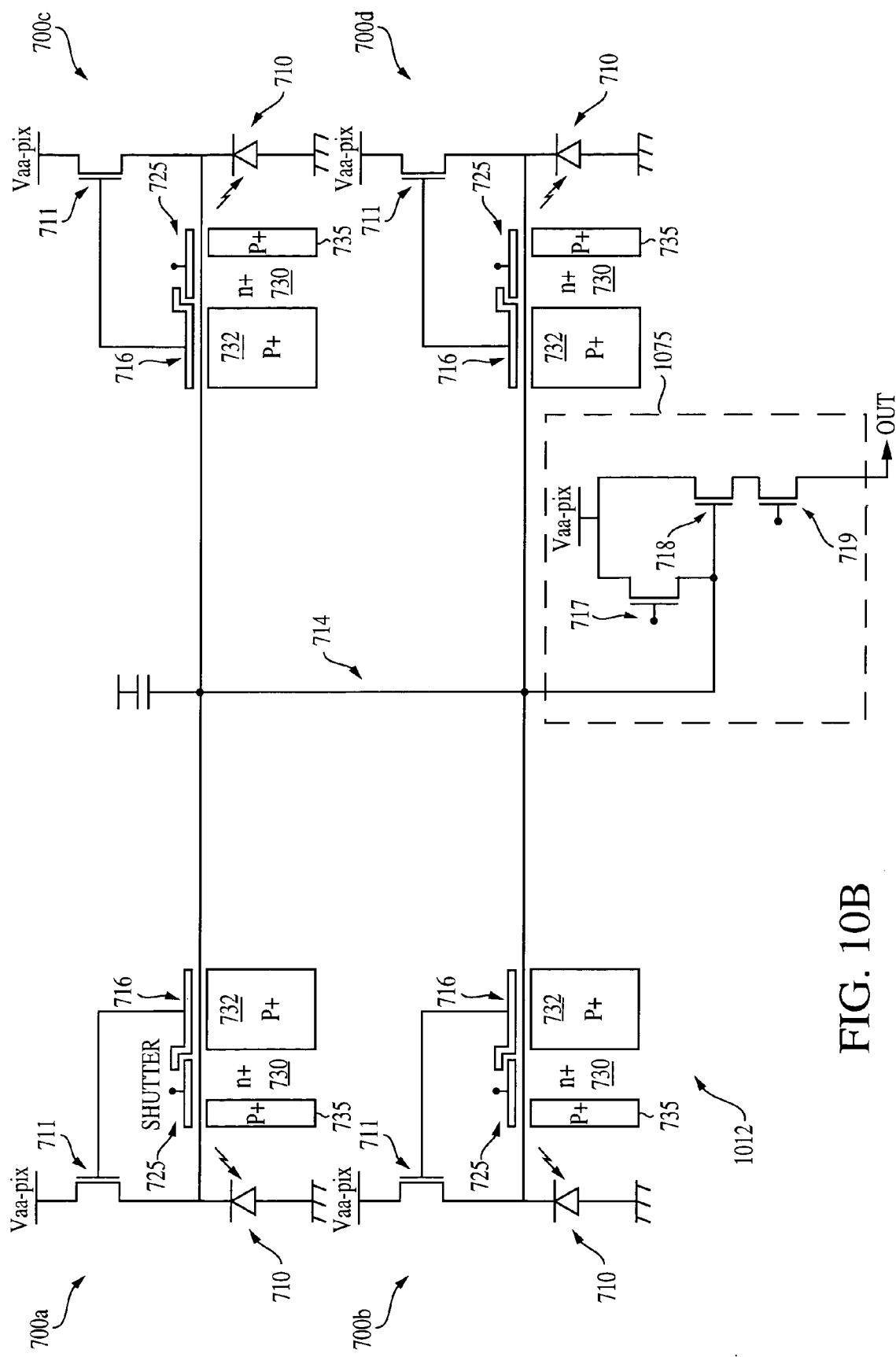

FIG. 9A, for example, illustrates a pixel circuit 991 including two pixel cells 600a, 600b as described above in connection with FIG. 6, which share a common floating diffusion node 614 and readout and reset circuitry 975. FIG. 9B illustrates a pixel circuit 992 including four pixel cells 600a, 600b, 600c, and 600d as described above in connection with FIG. 6, which share a common floating diffusion node 614 and readout and reset circuitry 975. FIG. 10A illustrates a pixel circuit 1011 including two pixel cells 700a and 700b as described above in connection with FIG. 7, which share a common floating diffusion node 714 and readout and reset circuitry 1075. FIG. 10B illustrates a pixel circuit 1012 including four pixel cells 700a, 700b, 700c, and 700d as described above in connection with FIG. 7, which share a common floating diffusion node 714 and readout and reset circuitry 1075.

Although pixel circuits 991, 992, 1011, and 1012 are depicted as including pixel cells as described above in connection with FIGS. 6 and 7, it should be noted that the transfer gates need not be connected to the anti-blooming gates as shown in FIGS. 9A-10B to practice the invention. Accordingly, pixel circuits which include two or more pixel cells sharing a floating diffusion node and readout and reset circuitry may also include pixel cells 200 and 400 described above in connection with FIGS. 2-5.

Figure 11A:
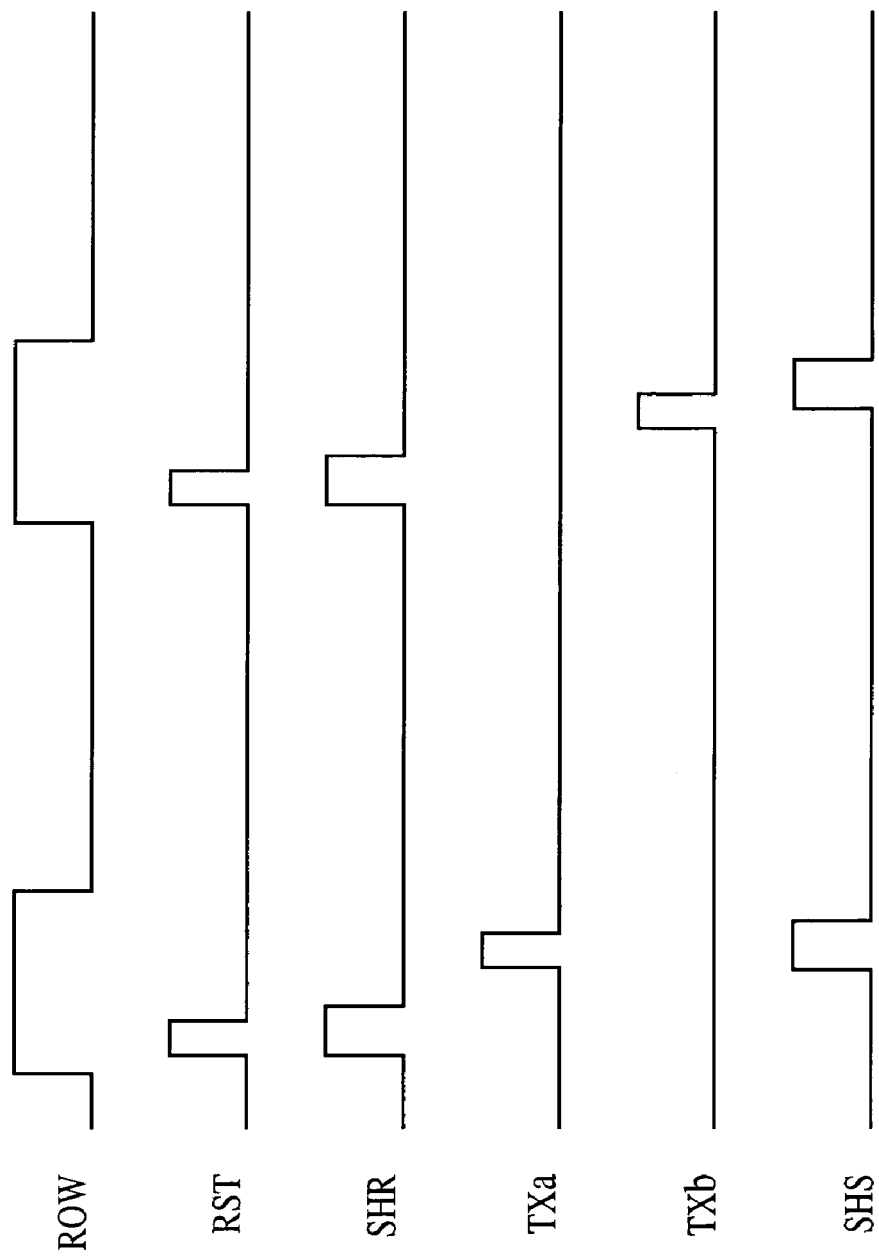
FIGS. 11A is an exemplary readout timing diagram for the FIG. 9A pixel circuit.

FIG. 11A is a timing diagram illustrating the timing of a readout process for the pixel circuit 991 according to an exemplary embodiment of the invention. The signals in FIG. 11A can be provided by timing and control circuitry similar to circuitry 156 in FIG. 1. Pixel circuit 1011 can operate similarly. When the two pixel cells 600a, 600b sharing a floating diffusion node 614 and readout and reset circuitry 975 reside in a same row or column of an array, two transfer gates 616a, 616b, which receive signals TXa and TXb, respectively, are utilized to transfer the respective photo-generated charge to the floating diffusion node 614 at the required timing.

Prior to readout, signals similar to those depicted in FIG. 8A are applied to pixel circuit 991 to cause pixel cells 600a and 600b to generate charge by respective pinned photo-diodes 610a and 610b, and to store the photo-generated charge in respective storage nodes 612a and 612b and respective capacitors 620a and 620b. Accordingly, a shutter signal is applied to each of shutter gates 615a and 615b. Referring to FIG. 11A, to readout pixel cell 600a, the row select gate 619 is pulsed on by a ROW signal. Reset gate 617 is briefly turned on by a RST signal, thereby resetting floating diffusion node 614 to a predetermined voltage, illustratively $V_{aa-pix}$. The charge on the floating diffusion node 614 is applied to source follower gate 618 and is translated to a voltage, $V_{rst-a}$, which is sampled by sample and hold circuitry (not shown) in response to an SHR signal.

A TXa signal is then pulsed high to turn on transfer gate 616a and stored photo-generated charge is then transferred from storage node 612a to floating diffusion node 614. Because the transfer gate 616a is connected to anti-blooming gate 611a, when the transfer gate 616a is turned on by a TXa signal, anti-blooming gate 611a is also turned on to reset pinned photodiode 610a to $V_{aa-pix}$. The photo-generated charge on floating diffusion node 614 is applied to the source follower gate 618 and is translated to a voltage, $V_{photo-a}$, which is sampled by sample and hold circuitry in response to an SHS signal. For readout correlated double sampling is performed and a differential signal, $V_{rst-a}-V_{photo-a}$, is obtained for pixel cell 600a.

To readout pixel cell 600b, a similar process is repeated, except that a TXb signal is used to turn on transfer gate 616b and transfer stored photo-generated charge from storage node 612b to floating diffusion node 614; and to turn on anti-blooming gate 611b to reset pinned photodiode 610b to $V_{aa-pix}$. Accordingly, a differential signal $V_{rst-b}-V_{photo-b}$, is obtained for pixel cell 600b. Readout for each pixel cell 600a and 600b occurs in a single output cycle. Consequently, the readout of pixel circuit 991 uses two output cycles.

Figure 11B:
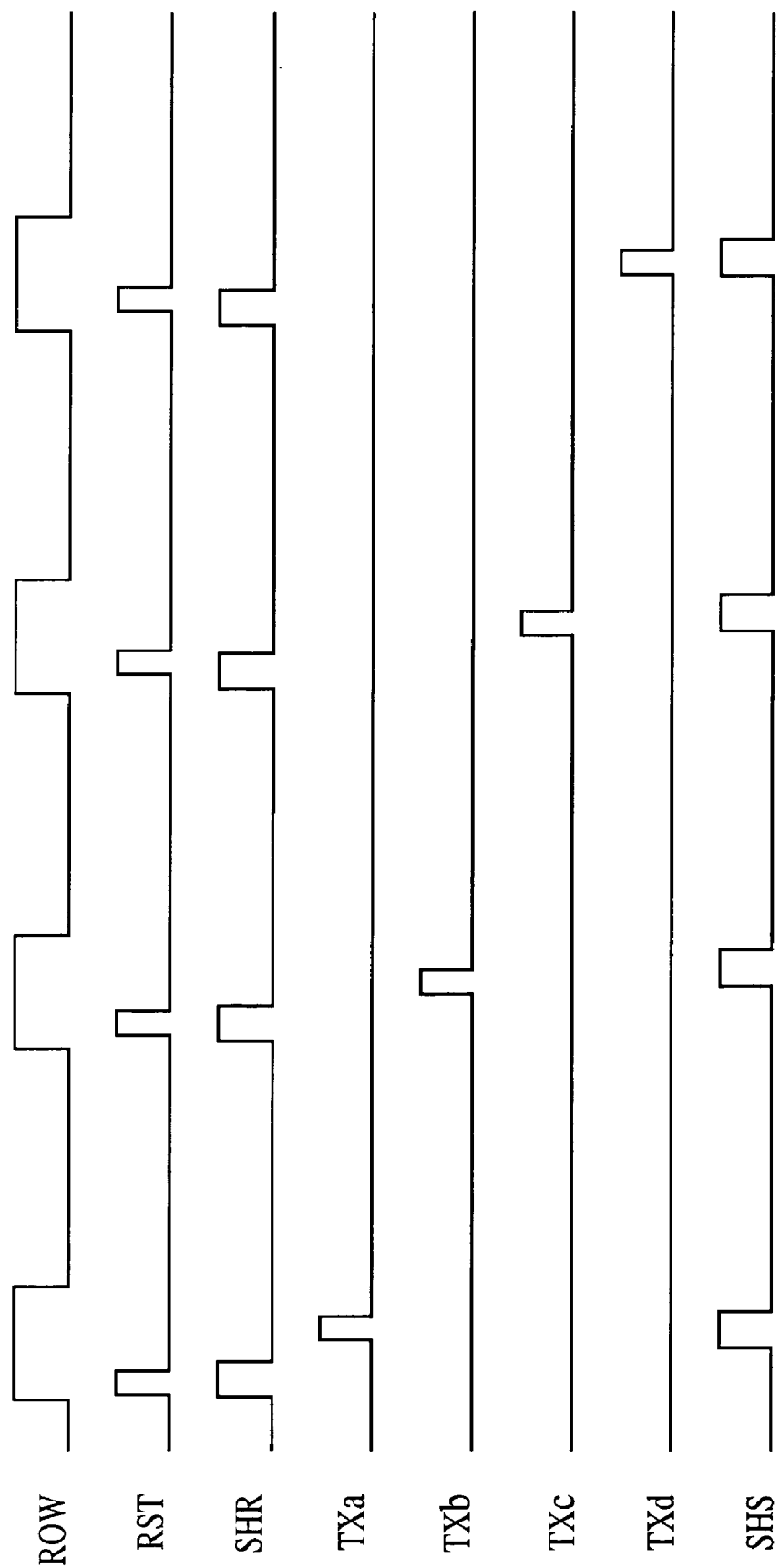
FIG. 11B is an exemplary readout timing diagram for the FIG. 9B pixel circuit.

FIG. 11B is a timing diagram illustrating the timing of a readout process for the pixel circuit 992 according to an exemplary embodiment of the invention. The signals in FIG. 11B can be provided by timing and control circuitry similar to circuitry 156 in FIG. 1. Four pixel cells 600a, 600b, 600c, and 600d are readout via floating diffusion node 614 and by the same readout and reset circuitry. Pixel circuit 1012 can operate similarly. Prior to readout, signals similar to those depicted in FIG. 8A are applied to pixel circuit 1012 to cause pixel cells 600a, 600b, 600c, and 600d to generate by respective pinned photodiodes 610a, 610b, 610c, and 610d and to store the photo-generated charge in respective storage nodes 612a, 612b, 612c, 612d, and respective capacitors 620a, 620b, 620c, 620d. Accordingly, a shutter signal is applied to each of shutter gates 615a, 615b, 615c, and 615d.

The readout process depicted in FIG. 11B is similar to the readout process described above in connection with FIG. 11A, except that two additional pixel cells 600c and 600d are read out using signals TXc and TXd, respectively. Signals TXc and TXd are applied to turn on transfer gates 616c and 616d, respectively, as well as to turn on anti-blooming gates 611c and 611d, respectively. Accordingly, differential signals $V_{rst-c}-V_{photo-c}$ and $V_{rst-d}-V_{photo-d}$ are obtained for pixel cells 600c and 600d, respectively. Additionally, the readout timing of circuit 1011 may use two output cycles; however, since four pixel cells are being output in the two output cycles, the readout of each pixel signal may occur on a half output cycle allowing the readout of two pixel cells per output cycle.

Figure 12:
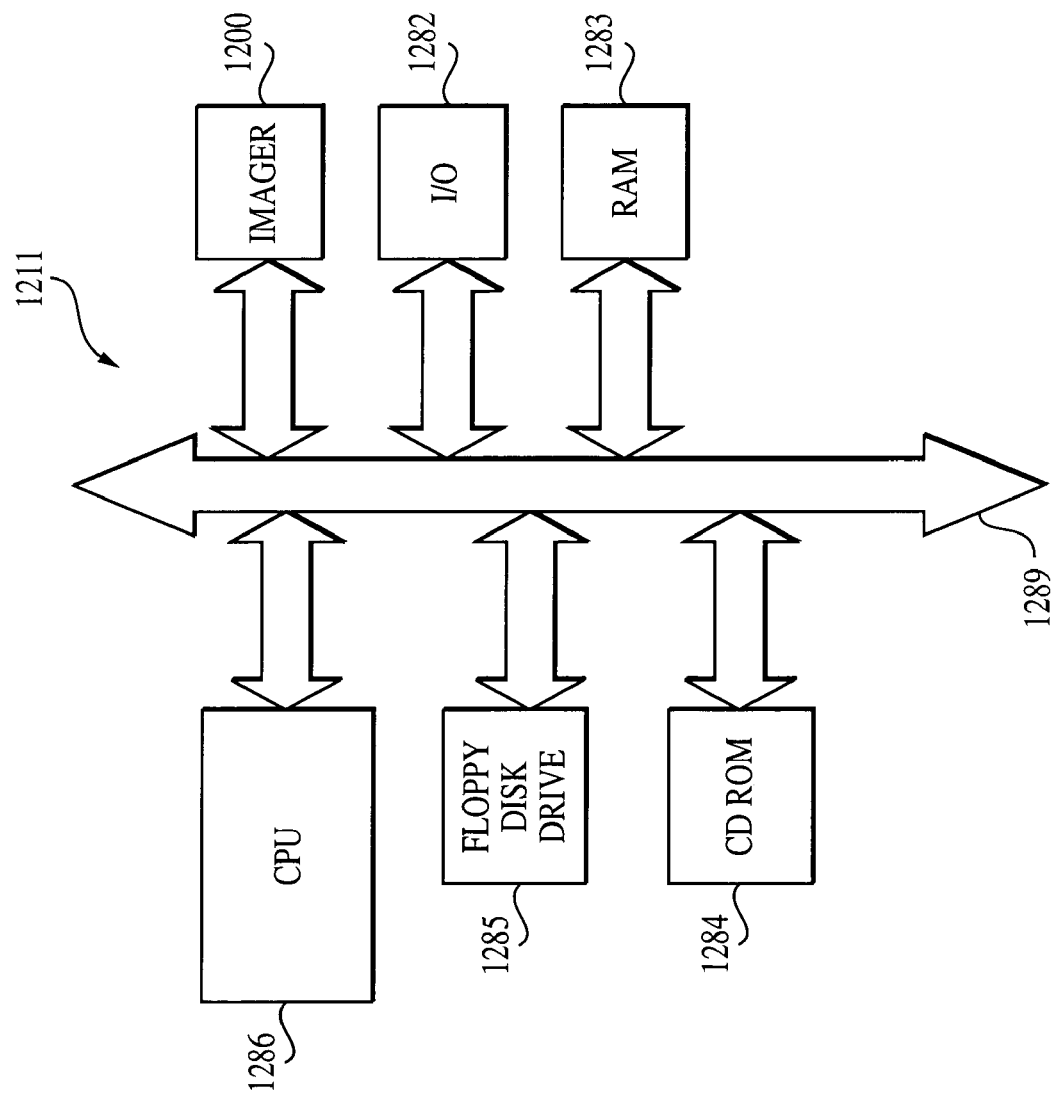
FIG. 12 is a schematic diagram of a processing system according to an exemplary embodiment of the invention.

Turning to FIG. 12, a processor-based system 1211 is described as including an imager device 1200 with pixel cells configured as described above in any one of FIGS. 2-10B. Processor-based system 1211 is exemplary of a system having digital circuits that could include CMOS imager devices. Without being limiting, such a system could include a computer system, camera system, scanner, machine vision, vehicle navigation, video phone, surveillance system, auto focus system, star tracker system, motion detection system, image stabilization system, and data compression system.

Processor-based system 1211 contains a central processing unit (CPU) 1286, such as a microprocessor, that communicates with an input/output (I/O) device 1282 over a bus 1289. Imager 1200, which produces an image output from a pixel array, also communicates with the CPU 1286 over bus 1289. The processor-based system 1211 also includes random access memory (RAM) 1283, and may include peripheral devices, such as a floppy disk drive 1285 and a compact disk (CD) ROM drive 1284, which also communicate with CPU 1286 over the bus 1289. Imager 1200 may be combined with a processor, such as a CPU, digital signal processor, or microprocessor, with or without memory storage on a single integrated circuit or on a different chip than the processor.

Embodiments of the present invention provide increased storage capacity and anti-blooming operations for an imager having an array of pixel cells. In an exemplary embodiment of an imager according to the invention, each pixel cell has an electronic shutter that transfers charge generated by a photo-conversion device to a storage node before further transferring the charge to the pixel cell's floating diffusion node. Each pixel cell also includes an anti-blooming transistor. By including a storage node in the pixel cell, the amount of charge the pixel cell can store is increased. Additionally, the anti-blooming transistor serves to improve image accuracy by preventing blooming. Further, the size of pixel cells may be minimized by connecting an anti-blooming gate to a transfer gate and/or by providing a common floating diffusion node and reset and readout circuitry for two or more pixel cells.

It is again noted that the above description and drawings are exemplary and illustrate exemplary embodiments that achieve the objects, features, and advantages of the present invention. It is not intended that the present invention be limited to the illustrated embodiments. Any modification of the present invention which comes within the spirit and scope of the following claims should be considered part of the present invention. Accordingly, the invention is not limited by the foregoing description or drawings, but is only limited by the scope of the appended claims.

What is claimed as new and desired to be protected by Letters Patent of the United States is:

1. A pixel cell comprising:
    a photo-conversion device;
    a storage node switchably coupled to the photo-conversion device for receiving charge from the photo-conversion device via a shutter transistor;
    a capacitor electrically connected to a gate of the shutter transistor and the storage node;
    a sensing node switchably coupled to the storage node for receiving the charge from the storage node; and
    an anti-blooming circuit electrically connected to the photo-conversion device for selectively draining charge from the photo-conversion device.

2. The pixel cell of claim 1, further comprising a readout and reset circuit electrically connected to the sensing node to output the charge accumulated at the sensing node.

3. The pixel cell of claim 2, wherein the readout and reset circuit comprises:
    a reset transistor electrically connected to the sensing node;
    a source-follower transistor, wherein the source follower transistor comprises a gate, wherein the source follower gate is electrically connected to the sensing node; and
    a row select transistor electrically connected to the source-follower transistor.

4. The pixel cell of claim 3, wherein at least one of the sensing node, reset transistor, source follower transistor, and row select transistor are shared with at least one other pixel cell.

5. The pixel cell of claim 3, wherein the anti-blooming circuit, reset transistors and source follower transistor are electrically connected to a common voltage source.

6. The pixel cell of claim 1, wherein the photo-conversion device is a pinned photodiode.

7. The pixel cell of claim 1, wherein the sensing node is a floating diffusion node.

8. The pixel cell of claim 1, wherein the anti-blooming circuit is an anti-blooming transistor.

9. The pixel cell of claim 8, wherein the sensing node is switchably coupled to the storage node by a transfer transistor, wherein the transfer transistor and the anti-blooming transistor each comprise respective gates, and wherein the gate of the anti-blooming transistor is electrically connected to the gate of the transfer transistor.

10. The pixel cell of claim 1, wherein the sensing node is switchably coupled to the storage node by a transfer transistor.

11. The pixel cell of claim 1, wherein the storage node is a doped region of a second conductivity type below a surface of a substrate.

12. The pixel cell of claim 1, wherein the capacitor is above a substrate.

13. The pixel cell of claim 1, wherein the capacitor is a polypropylene capacitor.

14. A pixel cell comprising:
    a photo-conversion device;
    a storage node switchably coupled to the photo-conversion device for receiving charge from the photo-conversion device via a shutter transistor, a gate of the shutter transistor being electrically connected to the storage node;
    a first barrier region adjacent to the storage node, the barrier region being electrically connected to the gate of the shutter transistor;
    a sensing node switchably coupled to the storage node for receiving the charge from the storage node; and
    an anti-blooming circuit electrically connected to the photo-conversion device for selectively draining charge from the photo-conversion device.

15. The pixel cell of claim 14, further comprising a readout and reset circuit electrically connected to the sensing node to output the charge accumulated at the sensing node.

16. The pixel cell of claim 15, wherein the readout and reset circuit comprises:
    a reset transistor electrically connected to the sensing node;
    a source-follower transistor, wherein the source follower transistor comprises a gate, wherein the source follower gate is electrically connected to the sensing node; and
    a row select transistor electrically connected to the source-follower transistor.

17. The pixel cell of claim 16, wherein at least one of the sensing node, reset transistor, source follower transistor, and row select transistor are shared with at least one other pixel cell.

18. The pixel cell of claim 16, wherein the anti-blooming circuit, reset transistor, and source follower transistor are electrically connected to a common voltage source.

19. The pixel cell of claim 14, wherein the photo-conversion device is a pinned photodiode.

20. The pixel cell of claim 14, wherein the sensing node is a floating diffusion node.

21. The pixel cell of claim 14, wherein the anti-blooming circuit is an anti-blooming transistor.

22. The pixel cell of claim 21, wherein the sensing node is switchably coupled to the storage node by a transfer transistor, wherein the transfer transistor and the anti-blooming transistor each comprise respective gates, and wherein the gate of the anti-blooming transistor is electrically connected to the gate of the transfer transistor.

23. The pixel cell of claim 14, wherein the sensing node is switchably coupled to the storage node by a transfer transistor.

24. The pixel cell of claim 14, wherein the storage node is a doped region of a second conductivity type below a surface of a substrate.

25. The pixel cell of claim 14, wherein the first barrier region is a heavily doped region of a first conductivity type below a surface of a substrate.

26. The pixel cell of claim 14, wherein the barrier region is between the photo-conversion device and the storage node.

27. The pixel cell of claim 14, further comprising a second barrier region between the barrier region and the sensing node.

28. The pixel cell of claim 27, wherein the second barrier region is a heavily doped region of a first conductivity type below a surface of a substrate.

29. A pixel sensor array comprising:
at least one subset of pixel cells at a surface of a substrate, the at least one subset comprising:
at least two photo-conversion devices;
at least two anti-blooming transistors, each anti-blooming transistor being electrically connected to a respective photo-conversion device for selectively draining charge from the respective photo-conversion device;
at least two storage nodes switchably coupled to a respective photo-conversion device for receiving charge from the respective photo-conversion device via a respective shutter transistor, a gate of each shutter transistor being electrically connected to a respective storage node; and
a sensing node switchably coupled to the storage nodes for receiving the charge from the storage nodes via respective transfer transistors, a gate of each transfer transistor being electrically connected to a respective gate of an anti-blooming transistor.

30. The array of claim 29, wherein the at least one subset of pixel cells further comprises a reset and readout circuit electrically connected to the sensing node.

31. The array of claim 30, wherein the reset and readout circuit comprises:
a reset transistor electrically connected to the floating diffusion node for resetting the voltage on the sensing node;
a source-follower transistor electrically connected to the reset transistor for receiving charge from the sensing node; and
a row select transistor electrically connected to the source-follower transistor for outputting a signal produced by the source follower transistor.

32. The array of claim 31, wherein the at least two anti-blooming transistors, the reset transistor, and the source follower transistor are electrically connected to a common voltage source.

33. The array of claim 29, wherein the sensing node is a floating diffusion node.

34. The array of claim 29, wherein the storage nodes are doped regions of a second conductivity type below the surface of the substrate.

35. The array of claim 29, wherein the at least one subset of pixel cells further comprise at least two barrier regions, each barrier region being between a respective photo-conversion device and a respective storage node, and wherein the barrier region is a doped region of a first conductivity type below a surface of the substrate.

36. The array of claim 29, wherein the at least one subset further comprises at least two capacitors, each capacitor electrically connected to a respective shutter gate and a respective storage node.

37. The array of claim 36, wherein the at least two capacitors are above the substrate.

38. The array of claim 36, wherein the at least two capacitors are polypropylene capacitors.

39. A processor-based system comprising:
a processor; and
an imager coupled to the processor, the imager comprising an array of pixel cells, at least one of the pixel cells comprising:
a photo-conversion device;
a storage node switchably coupled to the photo-conversion device for receiving charge from the photo-conversion device via a shutter transistor;
a capacitor electrically connected to a gate of the shutter transistor and the storage node;
a sensing node switchably coupled to the storage node for receiving the charge from the storage node; and
an anti-blooming circuit electrically connected to the photo-conversion device for selectively draining charge from the photo-conversion device.

40. A processor-based system comprising:
a processor; and
an imager coupled to the processor, the imager comprising an array of pixel cells, at least one of the pixel cells comprising:
a photo-conversion device;
a storage node switchably coupled to the photo-conversion device for receiving charge from the photo-conversion device via a shutter transistor, a gate of the shutter transistor being electrically connected to the storage node;
a first barrier region adjacent to the storage node, the barrier region being electrically connected to the gate of the shutter transistor;
a sensing node switchably coupled to the storage node for receiving the charge from the storage node;
a second barrier region between the storage node and the sensing node; and
an anti-blooming circuit electrically connected to the photo-conversion device for selectively draining charge from the photo-conversion device.

41. An integrated circuit comprising:
an array of pixel cells, each pixel cell comprising:
a photo-conversion device;
a storage node switchably coupled to the photo-conversion device for receiving charge from the photo-conversion device via a shutter transistor;
a capacitor electrically connected to a gate of the shutter transistor and the storage node;
a sensing node switchably coupled to the storage node for receiving the charge from the storage node; and
an anti-blooming circuit electrically connected to the photo-conversion device for selectively draining charge from the photo-conversion device.

42. The integrated circuit of claim 41, further comprising a readout and reset circuit electrically connected to the sensing node to output the charge accumulated at the sensing node.

43. The integrated circuit of claim 42, wherein the sensing node and readout and reset circuit are shared between at least two pixel cells of the array.

44. An integrated circuit comprising:
an array of pixel cells, each pixel cell comprising:
- a photo-conversion device;
- a storage node switchably coupled to the photo-conversion device for receiving charge from the photo-conversion device via a shutter transistor, a gate of the shutter transistor being electrically connected to the storage node;
- a first barrier region adjacent to the storage node, the barrier region being electrically connected to the gate of the shutter transistor;
- a sensing node switchably coupled to the storage node for receiving the charge from the storage node; and
- an anti-blooming circuit electrically connected to the photo-conversion device for selectively draining charge from the photo-conversion device.

45. The integrated circuit of claim 44, further comprising a second barrier region between the storage node and the sensing node.

46. The integrated circuit of claim 44, further comprising a readout and reset circuit electrically connected to the sensing node to output the charge accumulated at the sensing node.

47. The integrated circuit of claim 46, wherein the sensing node and readout and reset circuit are shared between at least two pixel cells of the array.

* * * * *

UNITED STATES PATENT AND TRADEMARK OFFICE
CERTIFICATE OF CORRECTION

PATENT NO. : 7,332,786 B2 Page 1 of 1
APPLICATION NO. : 10/721169
DATED : February 19, 2008
INVENTOR(S) : Altice, Jr. et al.

It is certified that error appears in the above-identified patent and that said Letters Patent is hereby corrected as shown below:

In column 11, line 62, in Claim 5, delete "transistors" and insert -- transistor, --, therefor.

Signed and Sealed this

Sixth Day of May, 2008

JON W. DUDAS
*Director of the United States Patent and Trademark Office*